United States Patent [19]

Ichikawa et al.

[11] Patent Number: 5,523,568
[45] Date of Patent: Jun. 4, 1996

[54] IMAGE SIGNAL PROCESSING METHOD IN SCANNING ELECTRON MICROSCOPE AND DEVICE THEREOF

[75] Inventors: Yoshiharu Ichikawa, Ibaraki; Yoshiaki Kashimura, Tsukuba, both of Japan

[73] Assignee: Texas Instruments Incorporated, Dallas, Tex.

[21] Appl. No.: 149,577

[22] Filed: Nov. 9, 1993

[30] Foreign Application Priority Data

Nov. 9, 1992 [JP] Japan .................... 4-323585

[51] Int. Cl.$^6$ .................................... H01J 37/256
[52] U.S. Cl. ........................ 250/310; 250/252.1
[58] Field of Search ...................... 250/306, 307, 250/310, 311, 252.1 R

[56] References Cited

U.S. PATENT DOCUMENTS

| | | | |
|---|---|---|---|
| 4,567,364 | 1/1986 | Kano et al. | 250/252.1 R |
| 4,766,311 | 8/1988 | Seiler et al. | 250/252.1 R |
| 4,818,873 | 4/1989 | Herriot | 250/310 |
| 4,847,495 | 7/1989 | Dubus | 250/307 |
| 5,001,344 | 3/1991 | Kato et al. | 250/307 |

Primary Examiner—Jack I. Berman
Assistant Examiner—Kiet T. Nguyen
Attorney, Agent, or Firm—William E. Hiller; Richard L. Donaldson

[57] ABSTRACT

An image signal processing method in which inspection of a specimen is performed based on the image data collected for the wafer or other specimen by scanning a pilot specimen in a scanning electron microscope, prior to the scanning of the specimen to be inspected. The number of scans of the specimen to be inspected can be reduced, the dose of the primary electrons irradiated can be reduced, and high-quality image data can be obtained in a short time. For a pilot specimen, the image data are collected by making multiple scans in a scanning electron microscope 1. From the obtained image data, the evaluated relative feature function ERFF of an electro-optical cylinder of a scanning electron microscope 1 is calculated (step S01). For the specimen as the inspection object, the image data are collected in a number of scans less than that for the aforementioned pilot specimen in a scanning electron microscope 1. The degraded image of the image data is then corrected using the evaluated relative feature function ERFF of the electro-optical cylinder of the scanning electron microscope (step S02).

8 Claims, 4 Drawing Sheets

IMAGE SIGNAL PROCESSING METHOD IN SCANNING ELECTRON MICROSCOPE AND DEVICE THEREOF

This invention concerns an image data processing method in a scanning electron microscope (SEM) and its device. In particular, this invention concerns an image data processing method in a scanning electron microscope and its device characterized by the fact that in the case when a scanning electron microscope is used to perform inspection of the semiconductor device and other specimens by collecting the image data of the specimen, the dose of irradiation of the primary electron beam on the specimen in the scanning electron microscope can be reduced as much as possible, while the image quality of the image data can be improved.

BACKGROUND OF THE INVENTION

It has been an established technology to make a precise inspection of semiconductor devices, etc. in a nondestructive way by means of a scanning electron microscope.

For example, with the advent of a 64-MBit dynamic random access memory (64 MDRAM), etc., the semiconductor devices are realized by means of lines as fine as 0.5 µm or even 0.35 µm. In this case, it is desired that the semiconductor device be inspected correctly by means of a scanning electron microscope.

Methods for realizing precise and correct inspections of a semiconductor device include the method of improvement of the scanning electron microscope itself and the method of improvement of the image data derived on the scanning electron microscope. This invention concerns the latter type of method.

In order to improve the image data derived by a scanning electron microscope, the noise, mainly the thermal noise, has to be suppressed. For this purpose, the number of scans of the scanning electron microscope on the semiconductor device or other specimen as the inspection object is increased in the conventional scheme.

When the scan number of the semiconductor device or other specimen being inspected by the scanning electron microscope is increased, the dose of the primary electrons irradiated on the semiconductor device or other specimen is increased, and the semiconductor device itself may be degraded. In particular, for inspection of a 64 MBit or higher-density DRAM, as the line width and layer thickness are very small inside the semiconductor device, the device may be degraded significantly under irradiation of the excessive dose of the primary electrons in the scanning electron microscope.

Also, as the scan number of the specimen is increased in the scanning electron microscope, the inspection time needed is prolonged, and the inspection efficiency is decreased.

OBJECT OF THE INVENTION

It is an object of this invention to provide an image data processing method in the scanning electron microscope and its device wherein the image quality of the image data derived by scanning the specimen can be improved without increasing the scan number of the specimen in the scanning electron microscope and thus without degradation of the specimen.

Also, another object of this invention is to provide an image data processing method and device in scanning electron microscope in which the inspection time can be shortened.

SUMMARY OF THE INVENTION

In accordance with this invention, a pilot specimen is formed under the same conditions as the intrinsic specimen which is the inspection object. In the scanning electron microscope, the pilot specimen and the inspection object specimen are scanned under the same conditions, and the scan image data are collected for them. In this case, a precondition that the evaluated relative feature function of the electro-optical cylinder of the scanning electron microscope has the Ergodic property (steady irregular process) for the aforementioned scans is observed. First of all, (1) multiple rounds of scans are performed for the pilot specimen in the scanning electron microscope, and the evaluated relative feature function of the electro-optical cylinder is calculated. Then, (2) scans with a number smaller than the number employed with respect to the pilot specimen are performed on the inspection object specimen, and the derived image data are used to compensate the evaluated relative feature function of the electro-optical cylinder, so that the image degraded by the electro-optical cylinder can be recovered, and the image quality of the image data can thus be improved.

That is, this invention provides an image signal processing method in a scanning electron microscope including the following stages: a stage in which from pilot image data or reference image data derived by means of multiple scans of a pilot specimen by the scanning electron microscope, the evaluated relative feature function of the electro-optical cylinder of the aforementioned scanning electron microscope is calculated; a stage in which the specimen image data are derived by making scans, with a number smaller than the number of scans of the aforementioned pilot specimen, for the specimen with the aforementioned scanning electron microscope as the object of inspection; and a stage in which the aforementioned evaluated relative feature function is used to amend the aforementioned specimen image data.

Also, this invention provides an image data processing device in a scanning electron microscope including means which converts the pilot or reference image data obtained in multiple scans of a pilot specimen in the scanning electron microscope to data in the frequency space, and which calculates the spectrum of the aforementioned frequency space and derives the evaluated relative feature function of the electro-optical cylinder of the scanning electron microscope; a means which derives the specimen image data by means of scans, with a number smaller than the number of scans of the aforementioned pilot specimen, for the specimen with the aforementioned scanning electron microscope taken as the test object; a means which converts the aforementioned specimen image data to data of the frequency space; a means which uses the aforementioned evaluated relative feature function to suppress the noise component contained in the aforementioned specimen image data derived by conversion to the aforementioned frequency space; and means which converts the specimen image data in the frequency space with the noise component suppressed back to the data in the actual space.

First of all, multiple scans are performed on a pilot specimen, such as a pilot semiconductor device (pilot wafer) in the scanning electron microscope to obtain reference image data, and the evaluated relative feature function of the electro-optical cylinder of the scanning electron microscope can be derived. The evaluated relative feature function of the electro-optical cylinder is a kind of function that represents characteristics of the electro-optical cylinder, that is, an indication of the state of degradation in the image data. As the pilot specimen is scanned for multiple scans in the scanning electron microscope, the evaluated relative feature function of the electro-optical cylinder of the scanning electron microscope can be calculated correctly.

Then, for the inspection object specimen prepared under the same conditions as those for the pilot specimen, scanning is performed in the scanning electron microscope for a number smaller than the scan number for the aforementioned pilot specimen, that is, with a dose of the primary electrons much lower than that for the aforementioned pilot specimen, and the image data for the specimen are collected by means of the scanning electron microscope.

For the derived image data of the specimen, correction for the degradation of the image is performed by means of the aforementioned evaluated relative feature function of the electro-optical cylinder calculated by using a pilot specimen.

In this way, the image degraded due to the electro-optical cylinder can be recovered.

It is preferred that as the aforementioned characteristics of the electro-optical cylinder of the scanning electron microscope are derived, the image data of the multiple scans of the pilot specimen be processed by means of discrete cosine transformation (DCT) to be converted to data in the reference frequency space, and the power spectrum or other spectrum be calculated for deriving the relative feature function of the aforementioned electro-optical cylinder.

In addition, corresponding to the aforementioned processing, in the aforementioned image recovery processing, for the image data derived in the multiple scans of the following specimen, DCT processing is performed so that the data are converted to the data in the frequency space; the data converted to the frequency space are amended by means of the aforementioned evaluated relative feature function of the electro-optical cylinder, followed by a reversal DCT processing so that the image data in the frequency space region are converted back to the image data in the real space region.

The image data with improved image quality are used in inspection of the specimen with results displayed on a CRT or other display unit.

Figure 1:
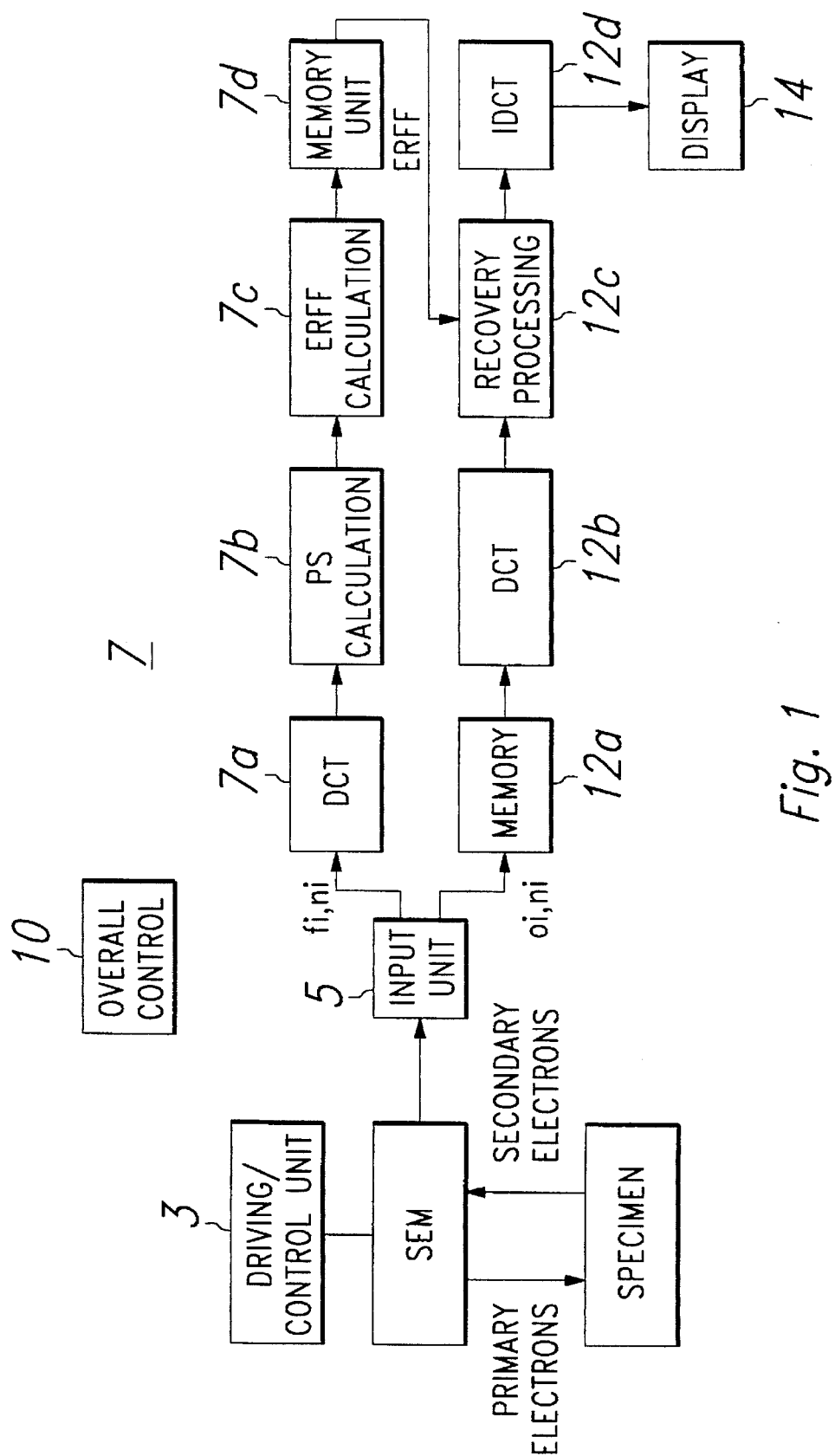
FIG. 1 is a block diagram illustrating a first embodiment of an image signal processing device in the scanning electron microscope in accordance with this invention.

In reference numerals as shown in the drawings:
1, scanning electron microscope
3, scanning electron microscope driving/control unit
5, image data input unit
7, SEM evaluated relative feature function operation processing unit
7a, DCT operation unit
7b, power spectrum calculation unit
7c, SEM evaluated relative feature function calculation unit
7d, SEM evaluated relative feature function memory unit
10, overall control processing unit
12, following semiconductor device image processing unit
12a, image data memory unit
12b, DCT operation unit
12c, degraded image recovery processing unit
12d, IDCT operation unit
14, image display unit

DESCRIPTION OF THE PREFERRED EMBODIMENTS

FIG. 1 shows a first embodiment of an image data processing device in a scanning electron microscope in accordance with this invention.

This image signal processing device using the scanning electron microscope has the following parts: scanning electron microscope (SEM) 1, scanning electron microscope driving/control unit 3, image data input unit 5 for input of the image data, processing unit 7 for calculating the evaluated relative feature function of the electro-optical cylinder of the SEM (referred to as the characteristic function of the electro-optical cylinder hereinafter), overall control processing unit 10, following semiconductor device image processing unit 12, and image display unit 14.

Processing unit 7 for calculating the evaluated relative feature function the of SEM comprises DCT operation unit 7a, power spectrum (PS) operation unit 7b, SEM relative feature function operation unit 7c, and evaluated relative feature function memory unit 7d.

The following semiconductor device image processing unit 12 comprises image data memory unit 12a, DCT operation unit 12b, degraded image recovery processing unit 12c, and IDCT operation unit 12d.

Scanning electron microscope 1 scans both pilot semiconductor device (pilot wafer) to obtain reference image data and the following semiconductor device (following wafer) to obtain specimen image data.

Scanning electron microscope driving/control unit 3 performs driving and control of scans of scanning electron microscope 1 under the control of overall control processing unit 10.

The image data derived by means of scans in scanning electron microscope 1 are input into image data input unit 5.

At evaluated relative feature function processing unit 7 of SEM, from the reference image data derived by means of scans of the pilot semiconductor device in scanning electron microscope 1, relative feature function ERFF of electro-optical cylinder of scanning electron microscope 1 is evaluated.

At the following semiconductor device image processing unit 12, after calculation of the relative feature function of the electro-optical cylinder by means of evaluated relative feature function operation unit 7 of SEM, for the semiconductor device manufactured under the same conditions as those for the pilot semiconductor device, that is for the semiconductor device as the inspection object, the image data derived by means of scans in scanning electron microscope 1 are processed with the aid of the evaluated relative feature function of the aforementioned electro-optical cylinder, so that the image degraded by the electro-optical cylinder is recovered.

Image display unit 14 displays the image data processed by evaluated relative feature function operation unit 7 for SEM and following semiconductor device image processing unit 12.

Overall control processing unit 10 performs overall control in the image signal processing device using the aforementioned scanning electron microscope.

The inspection of a semiconductor device which is performed using a scanning electron microscope 1 is carried out at various stages of operation in the manufacturing process of the semiconductor device. For example, this inspection may be performed in the stage after step depiction and after post etching processing, and in other stages when the semiconductor device is in the wafer state. The inspection may be performed for the semi-finished product (wafer) during the manufacturing process of the semiconductor device or the finished product of the semiconductor device. However, as described herein, the inspection stage is not specified. In the following description, both the semi-finished wafer and the finished product of the semiconductor device are referred to as the semiconductor device for convenience.

Figure 2:
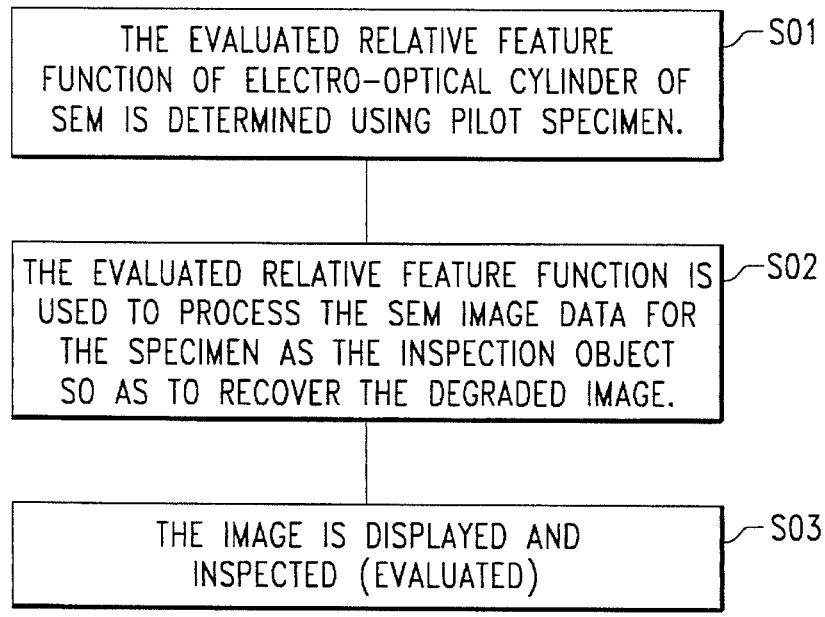
FIG. 2 is a flow chart illustrating the basic processing operation of the image signal processing device in the scanning electron microscope shown in FIG. 1.

The operation of the image signal processing device in a scanning electron microscope can be explained schematically with reference to FIG. 2. FIG. 2 is a flow chart which illustrates the basic processing operations of the image signal processing device in the scanning electron microscope.

Step S01: Calculation of evaluated relative feature function ERFF of the electro-optical cylinder of the scanning electron microscope for the pilot semiconductor device.

First of all, the reference image data derived in multiple (several) scans of the pilot semiconductor device by the scanning electron microscope 1 are collected. From these reference image data, the evaluated relative feature function ERFF of the electro-optical cylinder of the scanning electron microscope is calculated by means of SEM evaluated relative feature function operation unit 7. As far as the number of scans of the pilot semiconductor device using a scanning electron microscope 1 is concerned, the number should be sufficient to ensure good evaluation of the evaluated relative feature function of the electro-optical cylinder of the scanning electron microscope 1, such as 64 rounds.

Step S02: For the following semiconductor device, that is, the inspection object semiconductor device, recovery is performed for the degraded image data by means of the evaluated relative feature function of the electro-optical cylinder of SEM Then, for the following semiconductor device, which is the inspection object and is manufactured under the same conditions (in the same process) as those for the pilot semiconductor device, multiple scans are performed by a scanning electron microscope 1, and the image data are collected. For these degraded image data, correction is performed by means of the aforementioned evaluated relative feature function of the electro-optical cylinder of the scanning electron microscope so that the correct image data are obtained. The number of scans for the following semiconductor device by the scanning electron microscope 1 should be the smallest possible number of rounds to reduce the degradation of the semiconductor device caused by scans of the scanning electron microscope 1. Of course, this scan number should be smaller than the scan number for the pilot semiconductor device, such as about 3–4 scans.

Step S03: Inspection by means of image display

For the semiconductor device as the inspection object with its degraded image recovered, the image is displayed correctly on an image data display unit for inspection or evaluation of the semiconductor device.

That is, the characteristics of the electro-optical cylinder of the scanning electron microscope 1 are evaluated using a pilot semiconductor device under certain photographic conditions, and the characteristic dependence is compensated. In this way, the degradation of the image data collected for the following semiconductor device as caused by the electro-optical cylinder can be alleviated. In this way, it is possible to reduce the dose of the primary electrons irradiated on the inspection object following semiconductor device in the scanning electron microscope 1, while the image quality can be improved. Also, as the scan number can be reduced, the inspection time can be shortened.

The inspection described in said step S03 is identical to a conventional inspection. Consequently, its details will not be explained in the following description.

In the following description, details of the image signal processing device in the scanning electron microscope of this invention will be explained.

First of all, the nomenclature used in the following description is listed as follows.

TABLE I

| Symbol | Meaning |
|---|---|
| fi | Pilot observation image data or reference image data The pilot observation image is obtained by making smooth processing for the image data obtained in i scans of SEM for the semiconductor device used as a pilot specimen. In the following, suffix i represents i scans of SEM for the specimen with obtained image data processed by smoothing, it does not indicate the i'th specimen. |
| oi | Following observation image data The following observation image data are derived using SEM for the semiconductor device used as the following test object after the semiconductor device used as the pilot specimen. |
| si | True-value image data Hypothetical true image data free of error |
| ni | Noise image data Hypothetical true noise image data free of error |
| hi | Processed image data Actually processed image data |
| Fi | DCT value of pilot observation image data (discrete cosine transformation) |
| Oi | DCT value of following observation image data |
| Si | DCT value of true-value image data |
| Ni | DCT value of noise image data |
| PFi | Power spectrum of pilot observation image data |
| PSi | Power spectrum of true-value image data |
| PNi | Power spectrum of noise image data |
| ERFF | Evaluated relative feature function of electro-optical cylinder of scanning electron microscope |
| CERFF | Evaluated relative feature function coefficient |

First of all, processing indicated by step S01 in FIG. 2 will be described.

In the following explanation, it is assumed that there is no correlation between pilot observation image data fi collected by means of a scanning electron microscope 1 and noise image data ni.

Formula 1 shows the square-mean value of the difference (hi-fi) between processed image data hi, which are derived by making pilot observation image data fi pass through a linear filter to remove the high-frequency component, and pilot observation image data fi.

$$E\{|h_1-f_1|^2\} \quad (1)$$

Formula 2 shows the Wiener filter (most fitting linear filter) function Gi, which gives the smallest square mean value represented by Formula 1, as a function of true-value image data's power spectrum PSi and the noise image data's power spectrum PNi. The Wiener filter is an existing ideal filter for the noise and true-value image data's spectra.

$$Gi = \frac{PSi}{PSi + PNi} \quad (2)$$

In this case, it is assumed that true-value image data's power spectrum PSi and noise image data's power spectrum PNi have Ergodic property in the stochastic process with each pixel not affected by the other pixels. In other words, it is assumed that the collection mean value and the time mean value are in agreement with each other. As shown in Formulas 3 and 4, true-value image data's power spectrum PSi and noise image data's power spectrum PNi are in agreement with the square of DCT value Si of true-value image data si and the square value of DCT value Ni of the noise image data, respectively.

$$PS_1 = |S_1|^2 \quad (3)$$

$$PN_1 = |N_1|^2 \quad (4)$$

In addition, when DCT processing of the image data is performed, it means transformation from the image data in the real (physical) space to the image data in the frequency space. The inverse DCT processing to be presented following means return from the image data in the frequency space back to the image data in the real space.

However, power spectrum PSi of the true-value image data is unknown. Assuming the noise is mainly due to thermal noise, and it is irrelevant to the image signal, it is possible to replace Formula 2 by the following Formula 5.

$$Gi = \frac{PFi - PNi}{PFi} \quad (5)$$

In addition, by considering the Ergodic property of the true-value image data and the noise image data, Formulas 5 and 6 can be used for representation.

$$G_1 = \frac{|F_1|^2 - |N_1|^2}{|F_1|^2} \quad (6)$$

In this embodiment, as pilot observation image data fi, pilot observation image data $f_{64}$ were derived by means of 64 scans (i–64) for a pilot semiconductor device on a scanning electron microscope. From Formula 6, the following Formulas 7 and 8 were derived to represent Wiener filter function $G_{64}$ for DCT value $F_{64}$ of the pilot observation image data in 64 scans and Wiener filter function $G_1$ of DCT value $F_1$ of the pilot observation image data by one scan, respectively.

$$G_{64} = \frac{|F_{64}|^2 - |N_{64}|^2}{|F_{64}|^2} \quad (7)$$

$$G_1 = \frac{|F_1|^2 - |N_1|^2}{|F_1|^2} \quad (8)$$

From Formulas 7 and 8, the following Formula 9 is derived.

$$|F_{64}|^2 - |F_1|^2 = \{G_{64} \cdot |F_{64}|^2 - G_1 \cdot |F_1|^2\} + \quad (9)$$

$$|N_{64}|^2 - |N_1|^2 = \{S_{64} - S_1\} + |N_{64}|^2 - |N_1|^2$$

Although true-value image data si are not known, from the fact that true-value image data $s_{64}$ in the pilot observation image data obtained in 64 scans on the scanning electron microscope are in agreement with true-value image data si in the pilot observation image data derived in a single scan, the following Formula 10 is established.

$$S_{64} - S_1 = 0 \quad (10)$$

As Formula 10 is substituted into Formula 9, Formula 11 is derived.

$$|F_{64}|^2 - |F_1|^2 = |N_{64}|^2 - |N_1|^2 \quad (11)$$

In this case, in the 64 scans and single scan of the pilot semiconductor device, the noise itself cannot be measured. However, by calculating the difference in the square value of pilot observation image data fi between these two cases, it is possible to detect the difference in the absolute value of the noise.

As the noise in the signal theory corresponds to the transfer function in the observation system (observer), the difference in the absolute value of the noise can be equivalently handled as the difference of the energy of the characteristic function in the observation system.

That is, there is the following Formula 12:

$$|F_{64}|^2 - |F_1|^2 \quad (12)$$

The value represented by this formula can be taken as the evaluated relative feature function ERFF of the electro-optical cylinder of SEM derived from the pilot observation image data of the 64 scans of the pilot semiconductor device and the pilot observation image data of the single scan.

In the practical case, in consideration of coefficient $k_1$ as a factor for matching the difference in the signal intensity caused by difference in the number of scans, the following Formula 13 can be obtained.

$$|N_{64}|^2 - |N_1|^2 = k_1 \cdot |F_{64}|^2 - |F_1|^2 \quad (13)$$

From Formula 13, evaluated relative feature function ERFF of SEM becomes Formula 14.

$$ERFF = |N_{64}| - |N_1| \approx k_2 \sqrt{k_1 \cdot |F_{64}|^2 - |F_1|^2} \quad (14)$$

Coefficient $k_2$ represents the coefficient of evaluated relative feature function CERFF (coefficient of ERFF), and coefficients $k_1$ and $k_2$ can be derived experimentally. These coefficients $k_1$ and $k_2$ are what demanded by ERFF.

Figure 3:
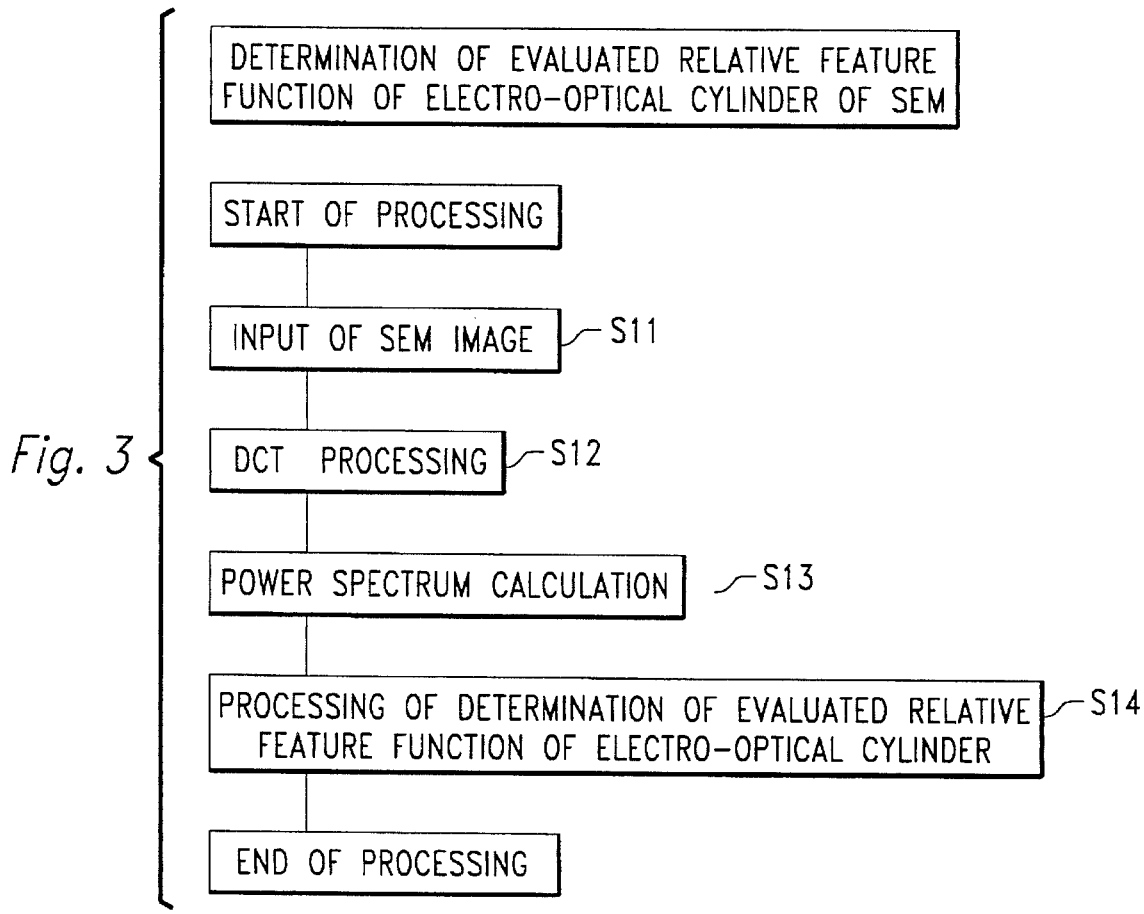
FIG. 3 is a flow chart illustrating the processing of the calculation of the evaluated relative feature function of the electro-optical cylinder in the scanning electron microscope (SEM) shown in the flow chart in FIG. 2.

The flow chart shown in FIG. 3 illustrates the method for calculating the evaluated relative feature function ERFF of the electro-optical cylinder of SEM as previously explained.

In this processing, first of all, the scanning electron microscope 1 is driven by a scanning electron microscope driving/controlling unit 3 shown in FIG. 1, and the pilot semiconductor device is scanned consecutively for 64 scans. The image data obtained in these 64 scans are input to image data input unit 5, and the aforementioned operation is carried out at SEM evaluated relative feature function processing unit 7.

Step S11: Pilot observation image data fi obtained in 64 scans of the pilot semiconductor device in a scanning electron microscope 1 are input to a processor for the pilot observation image data.

Step S12: In DCT operation unit 7a, DCT processing is carried out for said pilot observation image data fi, and DCT value Fi is calculated.

Step S13: In power spectrum operation unit 7b, power spectrum PFi is calculated from DCT value Fi of the pilot observation image data.

Step S14: In SEM evaluated relative feature function operation unit 7c, evaluated relative feature function ERFF of the electro-optical cylinder of the scanning electron microscope is calculated based on Formula 14.

The evaluated relative feature function ERFF of electro-optical cylinder of SEM calculated in this way is stored in SEM evaluated relative feature function memory unit 7d.

In the following, a detailed description will be represented for the processing shown as Step S02 in FIG. 2.

When the pilot specimen (pilot semiconductor device) and the following specimen (semiconductor device) are formed as the same [type of] device and under the same conditions, and when the pilot specimen and following specimen are scanned under the same conditions in the scanning electron microscope as their scan image data are collected, the Ergodic property is established for the evaluated relative feature function of the electro-optical cylinder of the scanning electron microscope in each scan scheme. Consequently, by using the evaluated relative feature function ERFF of the electro-optical cylinder of SEM calculated in the above, the degraded image data of the following semiconductor device with degradation depending on the electro-optical cylinder can be recovered.

When the space frequency region which performs DCT processing for the image data in the real space is considered, in the case of the frequency component of the signal region, increase in the scan number of the following semiconductor device in scanning electron microscope 1 makes contribution to an increase in the contrast of the secondary electron image; hence, the following Formula 15 is established.

$$|F_{64}|^2 - |F_i|^2 \approx |F_2|^2 - |F_4|^2 \approx |F_4|^2 - |F_i|^2 \quad (15)$$
$$(i = 1, \text{ or } 2)$$

Formula 15 indicates that even when the scan number in a scanning electron microscope 1 is increased, it is still impossible to reduce the noise monotonically; at the same time, multiple scans of the signal region makes it possible to derive the level of the intensity.

That is, in the frequency region where Formula 15 is established, the signal region can be strengthened in the processing to be explained below by as much as the fraction of strengthening of the power spectrum for the pilot semiconductor device.

$$O_1 \cdot k_3 \frac{|F_{64}|}{|F_1|} \quad (16)$$

Where, $k_3$ is a proportional constant.

On the other hand, when consideration is made for the space frequency region with DCT processing for the image data in the real space, in the case of the presence of the noise component of the signal region, increase in the scan number in scanning the following semiconductor device in a scanning electron microscope 1 decreases the contrast of the secondary electron image as contrary to the signal region; that is, as increase in the scan number leads to a monotonic decrease in the energy of the noise, one has the following Formula 17.

$$||F_{64}|^2 - |F_i|^2| > ||F_2|^2 - |F_4|^2| > ||F_4|^2 - |F_i|^2|$$
$$(i = 1, \text{ or } 2) \quad (17)$$

After multiplying both sides of Formula 17 with $[Fi]^2$ (square of the absolute value of Fi), one obtains Formula 18.

$$|F_{64}| < |F_8| < |F_4| \quad (18)$$

That is, for the noise region's frequency component, Formula 18 is established.

Although it is impossible to estimate the state of sign of the noise of DCT value Oi of the following observation image data, at least one can see that it is necessary to suppress the energy for the frequency judged as the noise region, and to approach the noise region state of the pilot image data obtained in multiple scans.

In this case, for the image data of the frequency judged as the noise region, the degraded image data are recovered by means of evaluated relative feature function ERFF of the electro-optical cylinder of SEM to reduce the energy.

For the case with scan number i=1, please see Formula 13.

If $O_1 > 0$ $$O1 - k_2 \sqrt{|k_1 \cdot |F_{64}|^2 - |F_1|^2|} \quad (19)$$

If $O_1 < 1$ $$O1 + k_2 \sqrt{|k_1 \cdot |F_{64}|^2 - |F_1|^2|} \quad (20)$$

When processing is performed, the energy is suppressed, and the noise state becomes similar to that of the image data when multiple scans (many times of scans) are made.

For the image data derived in this way, the inverse DCT (IDCT) processing is performed, and the image data in the frequency space are converted back to the image data in the real (physical) space, that is, the real image data.

The real image data are then displayed on the display unit, and are used for inspection of the following semiconductor device. As the degradation has been alleviated for the real image data, they are appropriate for use in inspection.

Figure 4:
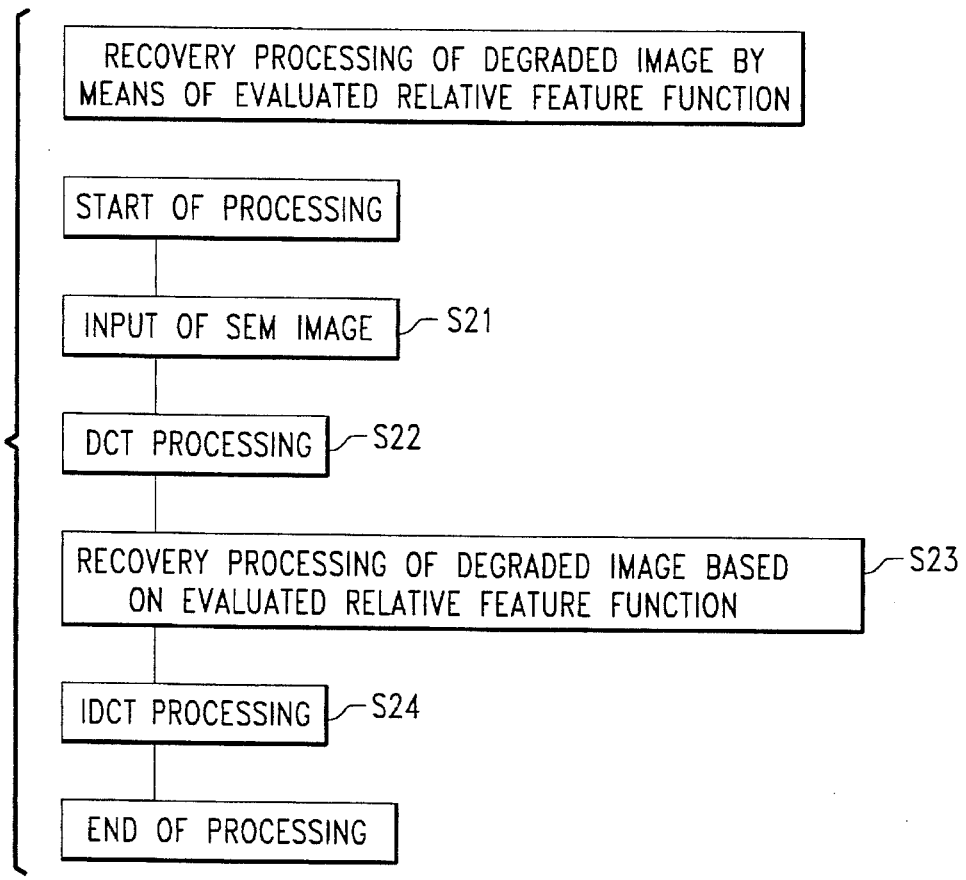
FIG. 4 is a flow chart illustrating the processing for improving the degraded image data for the following semiconductor device by means of the evaluated relative feature function of the electro-optical cylinder of the SEM with the flow chart shown in FIG. 2.

FIG. 4 is a flow chart illustrating the processing content of the degraded image. In the following description, an explanation will be presented on the processing content related to the operation of the image signal processing unit in the scanning electron microscope shown in FIG. 1.

Step S21: Following observation image data oi derived by making a few scans, say, 3–4 scans, for the following semiconductor device in a scanning electron microscope 1 are input. Input following observation image data oi are stored in image data memory unit 12a in following semiconductor device image processing unit 12.

In this embodiment, image data input unit 5 is used in both the case when the image data of the pilot semiconductor device are input and the case when the image data of the following semiconductor device are input.

Step S22: In DCT operation unit 12b within following semiconductor device image processing unit 12, DCT processing is performed for following observation image data oi stored in image data memory unit 12a, and its DCT value Oi is calculated.

Step S23: At degraded image recovery processing unit 12c, the evaluated relative feature function ERFF of the electro-optical cylinder of SEM stored in SEM evaluated relative feature function memory unit 7d is read, and DCT value Oi calculated in DCT operation unit 12b is corrected. In this way, recovery is performed for the degraded image data which are degraded by the electro-optical cylinder.

Step S24: In IDCT operation unit 12d, inverse DCT processing is performed for the recovered image data, and the real space image data are obtained.

After the aforementioned steps of processing, the image data in the real space obtained are displayed in image display unit 14.

As explained in the above, a small number of scans are enough for scanning the following semiconductor device in a scanning electron microscope 1. That is, the dose of the primary electrons irradiated on the following semiconductor device in a scanning electron microscope 1 can be reduced, and the damage on the following semiconductor device can be alleviated. In addition, by using the evaluated relative feature function ERFF of the electro-optical cylinder of SEM, clear image data can be obtained.

As the number of scans of the following semiconductor device in scanning electron microscope 1 can be reduced, the inspection time for multiple (many) following semiconductor devices can be shortened.

Also, in this invention, there is no need to remodel the scanning electron microscope 1 itself, and there is no need to perform complicated adjustments, and the aforementioned image signal processing can be realized easily and the operation can be implemented easily.

Implementation of the image signal processing method in the scanning electron microscope in this invention is not limited to the aforementioned embodiment. It can be performed in various forms.

Figure 5:
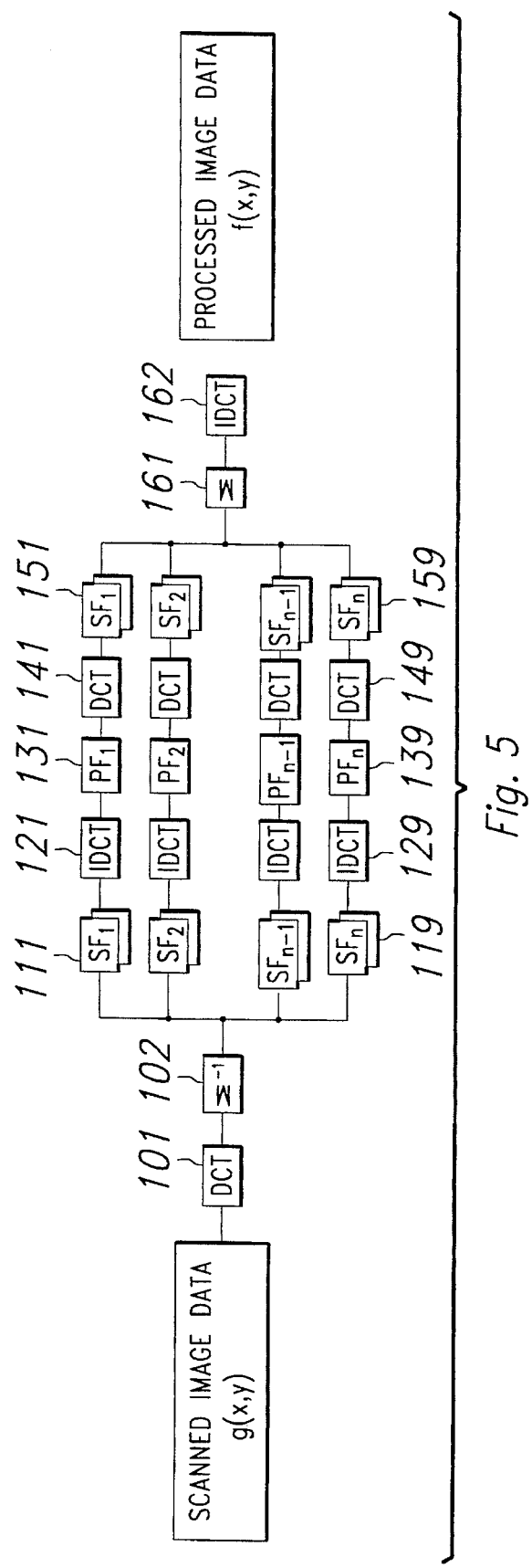
FIG. 5 is a block diagram illustrating a second embodiment of the image signal processing device in the scanning electron microscope in accordance with this invention.

For example, the image signal processing device in a specific type of scanning electron microscope shown in FIG. 5 can be used in place of the image signal processing unit in the scanning electron microscope shown in FIG. 1.

When this type of image signal processing device in a scanning electron microscope is used, the evaluated relative feature function ERFF of the electro-optical cylinder of SEM is derived beforehand for the pilot semiconductor device.

In this image signal processing device in a scanning electron microscope, the secondary electron image data g(x,y) from a scanning electron microscope 1 are DCT processed, and the data in the physical space are converted to the data in the frequency space by means of DCT circuit 101; the DCT-processed frequency space data are processed to find the mean value by mean value calculating circuit 102; there are also the following circuits: operation circuits 111–119 which reduce in a parallel way the mean image data in the frequency space by an amount corresponding to the SEM evaluated relative feature function ERFF of electro-optical cylinder of scanning electron microscope 1; inverse DCT processing circuits 121–129 which convert the data in the frequency space back to the data in the physical space; processing circuits 131–139 which can reduce the space noise component using the statistical method; DCT circuits 141–149 which convert the data in the physical space to the data in the frequency space; circuits 151–159 which perform reduction processing for the noise by Wiener filter; mean value calculating circuit 161; and inverse DCT circuit 162 which converts the image data in the frequency space back to the image data in the physical space.

In the image signal processing device in the scanning electron microscope shown in FIG. 5, in the same way as in the aforementioned image signal processing device in the scanning electron microscope, the image quality of the image data scanned by the scanning electron microscope 1 can be improved.

In the aforementioned embodiments, the specimens used are semiconductor devices and wafers. However, the image signal processing method and device in the scanning electron microscope of this invention are not limited to the semiconductor devices and wafers. They may also be used for other types of specimens for which high-precision electron image data free of influence by characteristics of the electro-optical cylinder are needed.

According to the image signal processing method in the scanning electron microscope of this invention, the image data can be improved to have a clear image independent of the characteristics of the electro-optical cylinder of the scanning electron microscope in a state with a reduced dose of primary electrons irradiated on the intrinsic specimen to be investigated in the scanning electron microscope.

Also, by using the image signal processing method in the scanning electron microscope of this invention, it is possible to reduce the number of scans of the specimen to be investigated in the scanning electron microscope; hence, the inspection time of the specimen can be cut, and the inspection efficiency can be increased.

We claim:

1. A method of processing image signals derived from a device by a scanning electron microscope, said method comprising the steps of:

initially scanning a reference specimen by the scanning electron microscope for a plurality of scans to provide reference image data;

determining an evaluated relative feature function of an electro-optical cylinder of the scanning electron microscope based upon the reference image data obtained from the plurality of scans of the reference specimen by the scanning electron microscope;

scanning the specimen to be inspected by the scanning electron microscope under the same conditions in effect for the scanning of the reference specimen, but for a plurality of scans smaller in number than the plurality of scans of the reference specimen by the scanning electron microscope in obtaining the reference image data for providing specimen image data; and correcting the specimen image data in accordance with the evaluated relative feature function of the electro-optical cylinder based upon the reference image data.

2. A method as set forth in claim 1, further including the steps of:

converting the reference image data obtained from the scanning of the reference specimen by the scanning electron microscope for a plurality of scans to frequency space reference data;

determining the power spectrum for the reference image data from the frequency space reference data; and determining the evaluated relative feature function of the electro-optical cylinder byderivation from the power spectrum for the reference image data.

3. A method as set forth in claim 2, further including the steps of:

converting the specimen image data to frequency space specimen data;

suppressing the noise component contained in the frequency space specimen data by using the evaluated relative feature function of the electro-optical cylinder; and re-converting the noise-suppressed frequency space specimen data back to the specimen image data as corrected for noise suppression.

4. A method as set forth in claim 3, wherein the conversion of the reference image data to the frequency space reference data is accomplished by processing the reference image data by discrete cosine transformation;

the conversion of the specimen image data to the frequency space specimen data is accomplished by processing the specimen image data by discrete cosine transformation; and following noise suppression contained in the frequency space specimen data by using the evaluated relative feature function of the electro-optical cylinder, the re-conversion of the noise-suppressed frequency space specimen data back to the specimen image data as corrected for noise suppression is accomplished by processing the noise-suppressed frequency space specimen data by reverse discrete cosine transformation.

5. A method as set forth in claim 2, wherein the conversion of the reference image data to the frequency space reference data is accomplished by processing the reference image data by discrete cosine transformation.

6. A method of processing image signals derived from a device by a scanning electron microscope, said method comprising the steps of:

determining an evaluated relative feature function of an electro-optical cylinder of a scanning electron microscope for a reference specimen;

processing specimen image data by discrete cosine transformation to convert the specimen image data to frequency space specimen data;

further processing the frequency space specimen data to determine the mean value of the frequency space specimen data;

subjecting the mean value frequency space specimen data to processing in a plurality of parallel processing procedures for reducing the mean value frequency space specimen data by an amount corresponding to the evaluated relative feature function of the electro-optical cylinder of the scanning electron microscope, including re-converting the frequency space specimen data back to the specimen image data, reducing the space noise component in the re-converted specimen image data, converting the noise-corrected specimen image data to the frequency space specimen data, further reducing the noise component by filtering the frequency space specimen data, and reconstituting the resultant frequency space specimen data from the plurality of parallel processing procedures into a single processing procedure;

determining the mean value of the reconstituted resultant frequency space specimen data; and re-converting the reconstituted resultant frequency space specimen data back to specimen image data as corrected for noise suppression.

7. A method as set forth in claim 6, wherein the re-conversion of the frequency space specimen data back to the specimen image data and the subsequent conversion of the noise-corrected specimen image data to the frequency space specimen data as carried out in the plurality of parallel processing procedures are respectively accomplished by reverse discrete cosine transformation and discrete cosine transformation.

8. A method as set forth in claim 7, wherein the noise reduction by filtering within the plurality of parallel processing procedures on the frequency space specimen data as corrected for noise suppression is accomplished by respective Wiener filters.

* * * * *